(12) United States Patent
Hokao (10) Patent No.: US 7,088,974 B2
(45) Date of Patent: Aug. 8, 2006

(54) MOBILE STATION CAPABLE OF PERFORMING AUTOMATIC FREQUENCY CONTROL BASED ON CORRESPONDENCE OF FREQUENCY ERROR AND TCXO CONTROL VOLTAGE TO BASE STATION

(75) Inventor: Tomoaki Hokao, Tokyo (JP)

(73) Assignee: NEC Corporation, Tokyo (JP)

( * ) Notice: Subject to any disclaimer, the term of this patent is extended or adjusted under 35 U.S.C. 154(b) by 1120 days.

(21) Appl. No.: 10/021,258

(22) Filed: Dec. 19, 2001

(65) Prior Publication Data

US 2002/0177458 A1 Nov. 28, 2002

(30) Foreign Application Priority Data

Dec. 20, 2000 (JP) ............... 2000-387483

(51) Int. Cl.
*H04B 1/18* (2006.01)
(52) U.S. Cl. ............... 455/192.1; 455/192.2; 455/255
(58) Field of Classification Search ............. 455/192.1, 455/255, 132, 258, 434, 164.1, 515, 260, 455/192.2; 375/344, 362
See application file for complete search history.

(56) References Cited

U.S. PATENT DOCUMENTS

| 5,661,724 | A | 8/1997 | Chennakeshu et al. |
| 5,943,329 | A | 8/1999 | Ohgoshi et al. ............. 370/335 |
| 6,226,505 | B1 | 5/2001 | Uda ............. 455/255 |
| 6,275,699 | B1 | 8/2001 | Ichihara ............. 455/434 |
| 6,292,477 | B1 | 9/2001 | Ohgoshi et al. ............. 370/335 |
| 2001/0004373 | A1* | 6/2001 | Hirata ............. 375/130 |
| 2001/0033627 | A1* | 10/2001 | Syrjarinne ............. 375/354 |

FOREIGN PATENT DOCUMENTS

| EP | 0 991 189 A2 | 9/1999 |
| JP | 10-150682 | 6/1998 |
| JP | 10-164658 | 6/1998 |
| JP | 2000-4177 | 1/2000 |
| JP | 2000-082976 | 3/2000 |
| JP | 2000-115056 | 4/2000 |

* cited by examiner

*Primary Examiner*—Melur Ramakrishnaiah
(74) *Attorney, Agent, or Firm*—Foley & Lardner LLP

(57) ABSTRACT

A mobile station is disclosed for performing an automatic frequency control based on a correspondence of a frequency error and TCXO control voltage to a base station. A plurality of frequency error measuring units each measure a frequency error between an internal clock signal and a clock signal in a specified base station. A plurality of control voltage calculators, each associated with a corresponding one of the plurality of frequency error measuring units, integrate a frequency error measured by the corresponding frequency error measuring unit to produce a control voltage. A control voltage selector selects a control voltage corresponding to a base station currently in communication with the mobile station from among control voltages calculated by the plurality of control voltage calculators. A clock signal generator generates an internal clock signal at a frequency in accordance with the selected control voltage. A memory has stored therein a set of a scramble code of each base station corresponding to a frequency error measured by a frequency error measuring unit corresponding to the base station, and a control voltage selected by the control voltage selector. Later, when the mobile station switches a base station unitized for the frequency control (hand-over), a frequency error and TCXO control voltage corresponding to a scramble code (or identification ID) of a base station, to which the mobile station is newly connected for communication, are read from the memory, when the scramble code is stored in the memory, for utilizing in the frequency control.

10 Claims, 8 Drawing Sheets

MOBILE STATION CAPABLE OF PERFORMING AUTOMATIC FREQUENCY CONTROL BASED ON CORRESPONDENCE OF FREQUENCY ERROR AND TCXO CONTROL VOLTAGE TO BASE STATION

BACKGROUND OF THE INVENTION

1. Field of the Invention

The present invention relates to a mobile station which performs a frequency control for synchronizing the frequency of an internal clock signal in the mobile station to the frequency of a clock signal in a base station.

2. Description of the Related Art

For a mobile station to correctly demodulate a signal received from a base station, symbols in the received signal must appear at predetermined locations on a phase plane in accordance with a particular modulation scheme. To this end, the mobile station performs an automatic frequency control for synchronizing the frequency of an internal clock signal in the mobile station to the frequency of a clock signal in the base station.

A conventional automatic frequency control in a CDMA mobile station is performed only making use of an error in the frequency of an internal clock signal in the CDMA mobile station with respect to the frequency of a clock signal in a base station (cell/sector) to which the CDMA mobile station is currently in connection for standby, position registration, communication therewith, or the like. For this reason, in the event of hand-over for switching from a base station (cell/sector) in communication due to the CDMA mobile station being turned on or returning from an out-of-coverage area, fluctuations in reception power, and the like, the CDMA mobile station requires a long time to converge, to a certain range, a frequency error of the frequency of the internal clock signal in the CDMA mobile station with respect to the frequency of a clock signal in a base station (cell/sector), to which the CDMA mobile station is newly connected.

In addition, a conventional automatic frequency control for use in a CDMA mobile station employs a method of previously storing a TCXO (temperature-compensated crystal oscillator) control voltage for reducing a time required to converge a frequency error to a certain range when the CDMA mobile station is turned on or returns from an out-of-coverage area. This method stores in a memory a TCXO control voltage when a frequency error is below a certain threshold, i.e., when AFC (Automatic Frequency Control) is locked, such that the TCXO control voltage is read from the memory for use as an initial value for the TCXO control voltage when the CDMA mobile station is turned on or returns from an out-of-service range. However, this method can suffer from an instantaneous increase in the frequency error, on the contrary, when a plurality of base stations present errors in frequency among them.

SUMMARY OF THE INVENTION

It is an object of the present invention to provide a mobile station which is capable of performing an automatic frequency control for immediately synchronizing the frequency of an internal clock signal used therein to the frequency of a clock signal used in a base station, to which the mobile station is newly connected, when the mobile station is turned on, returns from an out-of-coverage area, hand over, or the like.

To achieve the above object, according to one aspect of the present invention, a mobile station includes a plurality of frequency error measuring means, a plurality of control voltage calculating means, control voltage selecting means, and clock signal generating means. The plurality of frequency error measuring means each measure a frequency error between an internal clock signal and a clock signal of a specified base station. The plurality of control voltage calculating means are each associated with corresponding one of the plurality of frequency error measuring means for integrating a frequency error measured by the corresponding frequency error measuring means to produce a control voltage. The control voltage selecting means selects a single control voltage corresponding to a base station currently in communication with the mobile station from among control voltages calculated by the plurality of control voltage calculating means. The clock signal generating means generates the internal clock signal at a frequency in accordance with the control voltage selected by the control voltage selecting means.

Also, according to one embodiment of the present invention, the mobile station further includes means for storing in a memory a set of a scramble code of each base station corresponding to a frequency error measured by each of the frequency error measuring means corresponding to the base station, and the single control voltage selected by the control voltage selecting means.

According to one embodiment of the present invention, the mobile station further includes means operative when the mobile station is turned on, returns from an out-of-coverage area, or hand over, for reading from the memory a frequency error and a control voltage corresponding to a scramble code of a base station to which the mobile station is newly connected for communication, when the scramble code is stored in the memory, to set the frequency error and the control voltage in a single control voltage calculating means, and for selecting the control voltage calculating means by the control voltage selecting means.

According to one embodiment of the present invention, the mobile station further includes means operative when the mobile station is turned on, returns from an out-of-coverage area, or hand over, for setting a frequency error equal to zero and a control voltage set at a center value in a single control voltage calculating means, when the memory does not store a scramble code of a base station to which the mobile station is newly connected for communication, and for selecting the control voltage calculating means by the control voltage selecting means.

Also, according to one embodiment of the present invention, the mobile station further includes means for switching a control voltage selected by the control voltage selecting means when the mobile station hand over.

Also, according to one embodiment of the present invention, the mobile station may further include means for setting a control voltage calculated by control voltage calculating means which had supplied a control voltage selected before a hand-over, in control voltage calculating means which supplies a control voltage selected after the hand-over.

Further, according to another aspect of the present invention, a mobile station includes a plurality of frequency error measuring means, frequency error selecting means, control voltage calculating means, and clock signal generating means.

The plurality of frequency error measuring means each measure a frequency error between an internal clock signal and a clock signal of a specified base station. The frequency error selecting means selects a single frequency error corresponding to a base station currently in communication with the mobile station from among frequency errors measured by the plurality of frequency error measuring means. The control voltage calculating means integrates a selected frequency error to produce a control voltage. The clock signal generating means generates the internal clock signal at a frequency in accordance with the control voltage.

Also, according to another embodiment of the present invention, the mobile station further includes means for switching a frequency error selected by the frequency error selecting means when it hand over.

Also, according to another embodiment of the present invention, the mobile station may further include means for setting a frequency error equal to zero in control voltage calculating means which supplies a control voltage selected after the hand-over, when a base station after the hand over has not been assigned to any frequency error control means before the hand-over.

According to the present invention, the CDMA mobile station simultaneously measures frequency errors for a plurality of base stations (cells/sectors) irrespective of whether it is in a hand-over condition or not, thereby making it possible to realize an optimal frequency control. Specifically, the CDMA mobile station measures a frequency error at all times for a base station (cell/sector) which presents the reception power, as measured as the CDMA mobile station, equal to or higher than a certain threshold irrespective of whether it is in a hand-over condition or not, and stores a scramble code (or identification ID) of the base station (cell/sector) as well as the frequency error and a current TCXO control voltage corresponding to the scramble code in the memory as a set.

When there are a plurality of base stations (cells/sectors) which present reception power equal to or higher than the threshold value, the CDMA mobile station utilizes a frequency error for a base station (cell/sector) which is connected thereto (for standby, position registration or communication) for the actual frequency control. Simultaneously with this, the CDMA mobile station continuously measures frequency errors for other base stations (cells/sectors) and stores the measured frequency errors in the memory without interruption.

Later, when the CDMA mobile station switches the base station utilized for the frequency control (hand over), caused by its powering-on or returning from an out-of-coverage area, fluctuations in reception power, or the like, a frequency error and TCXO control voltage corresponding to a scramble code (or identification ID) of a new base station (cell/sector), to which the CDMA mobile station is to be newly connected, are read from the memory, when it is stored therein, for utilization in the new frequency control, thereby making it possible to rapidly converge the frequency error for the new base station.

The above and other objects, features and advantages of the present invention will become apparent from the following description with reference to the accompanying drawings which illustrate examples of the present invention.

DETAILED DESCRIPTION OF THE PREFERRED EMBODIMENTS

First Embodiment

Figure 1:
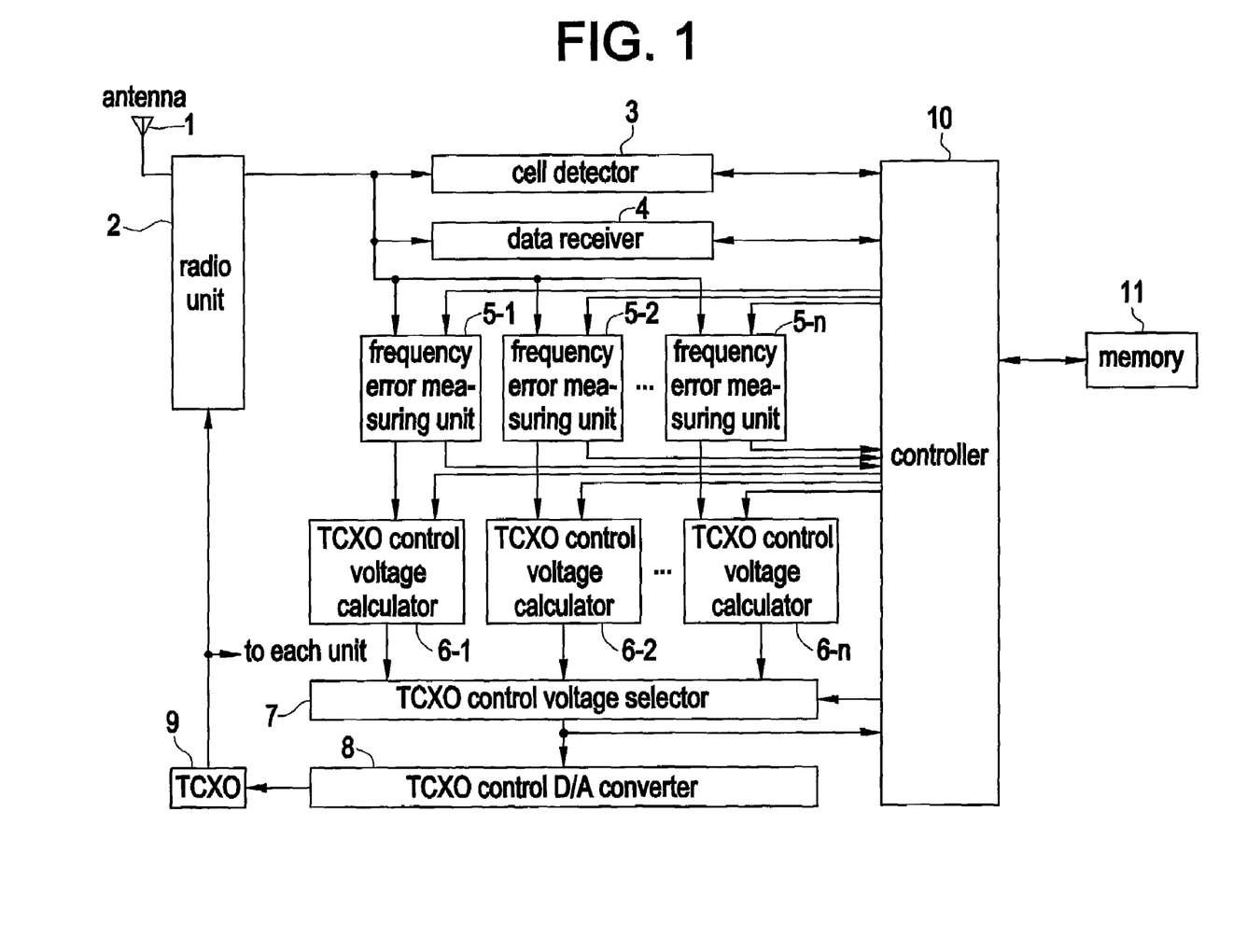
FIG. 1 is a block diagram illustrating the configuration of a CDMA mobile station according to a first embodiment of the present invention.

Referring to FIG. 1, a CDMA mobile station according to a first embodiment of the present invention comprises antenna 1; radio unit 2; cell detector 3; data receiver 4; a plurality of frequency error measuring units 5-1–5-n; a plurality of TCXO control voltage calculators 6-1–6-n; TCXO control voltage selector 7; TCXO control D/A converter 8; TCXO 9; controller 10; and memory 11.

Antenna 1 radiates transmission waves delivered from radio unit 2 into the space, and receives incoming waves from the space. Radio unit 2 comprises a transmission unit and a reception unit. The transmission unit analog-to-digital (D/A) converts a baseband signal of data to be transmitted to an analog baseband signal, and then orthogonally modulates the analog baseband signal to produce a radio signal. The reception unit orthogonally demodulates a received radio signal to produce an analog baseband signal, and A/D converts the analog baseband signal to produce received data. Radio unit 2 also utilizes a clock signal supplied from TCXO 9 to generate a reference clock signal for A/D conversion and D/A conversion, to generate a local frequency for orthogonal modulation and orthogonal demodulation, and to generate a local frequency for frequency conversion performed by a mixer.

Cell detector 3 searches a plurality of base stations (cells/sectors) for detection. Cell detector 3 also measures reception power for each of the detected base stations (cells/sectors), and sends to controller 10 information (scramble code, frame timing, identification ID and the like) of base stations (cells/sectors), the reception power of which is equal to or higher than a certain threshold.

Data receiver 4 performs processing involved in reception of data from a plurality of base stations (cells/sectors) in accordance with the information (scramble code, frame timing and the like) of base stations (cells/sectors) specified by controller 10. Data receiver 4 comprises a rake receiver for combining received signals from a plurality of base stations in a maximum ratio. Even a signal from a single base station may be received as a plurality of signals due to a multipath effect. Each of fingers in the rake receiver comprises a despread code signal generator and a despreader. The despread code signal generator generates a despread code signal having a phase in accordance with an associated base station and a delay time introduced by a path. The despreader multiplies the received signal by the despread code signal to receive desired waves for a path associated with a single base station specified by controller 10. The rake receiver acquires a single desired wave by combining desired waves received by a plurality of fingers in a maximum ratio in a rake unit. Also, a transmission path error included in the desired wave acquired by the rake unit is corrected through Viterbi decoding and Turbo decoding.

Each of frequency error measuring units 5-1–5-n receives a pilot signal (signal having a known pattern) from the base station (cell/sector) specified by controller 10 through the rake receiver, utilizing the information (scramble code, frame timing and the like) on the specified base station (cell/sector). Then, each of frequency error measuring units 5-1–5-n measures rotation of the pilot signal on a phase plane to measure a frequency error of the frequency of an internal clock signal (output frequency of TCXO 9) in the CDMA mobile station with respect to the frequency of a clock signal in the specified base station (cell/sector). It should be noted that while the rake receiver in data receiver 4 receives signals from a plurality of base stations, the rake receiver in each of frequency error measuring units 5-1–5-n only receives a signal from a single base station. Also, each of frequency error measuring units 5-1–5-n applies the measured frequency error to corresponding TCXO control voltage calculator 6-i ($1 \leq i \leq n$), and informs controller 10 of the measured frequency error together with the scramble code (or identification ID) of the specified base station (cell/sector) and TCXO control voltage as a set. However, the TCXO control voltage is applied from TCXO control voltage selector 7 to controller 10.

Each of TCXO control voltage calculators 6-1–6-n integrates a frequency error from corresponding frequency error measuring unit 5-i ($1 \leq i \leq n$) to calculate the TCXO control voltage. Alternatively, controller 10 may set a frequency error and TCXO control voltage for each of TCXO control voltage calculators 6-1–6-n, instead of integrating the frequency error from frequency error measuring unit 5-i to calculate the TCXO control voltage in each of TCXO control voltage calculators 6-1–6-n.

TCXO control voltage selector 7 selects one of TCXO control voltages calculated by TCXO control voltage calculators 6-1–6-n in accordance with an instruction from controller 10, and supplies the selected TCXO control voltage to TCXO control D/A converter 8. Here, controller 10 generates an instruction to TCXO control voltage selector 7 such that it selects a TCXO control voltage applied by particular TCXO control voltage calculator 6-i ($1 \leq i \leq n$) corresponding to a base station which originates a mainly received signal. Also, TCXO control voltage selector 7 informs controller 10 of the selected TCXO control voltage together with a scramble code (or identification ID) of a base station (cell/sector) corresponding to the selected TCXO control voltage, and a frequency error as a set. However, controller 10 is informed of the frequency error by frequency error measuring unit 5-i ($1 \leq i \leq n$) corresponding to the selected TCXO control voltage.

TCXO control D/A converter 8 D/A converts the TCXO digital control voltage from TCXO control voltage selector 7 to generate a TCXO analog control voltage which is supplied to TCXO 9.

TCXO 9 generates an internal clock signal at a frequency in accordance with the TCXO analog control voltage from TCXO control D/A converter 8, and applies the internal clock signal to radio unit 2 and respective components which use the internal clock signal for processing digital signals.

Controller 10 sends the information (scramble code, frame timing, identification ID and the like) of the base station (cell/sector) which data receiver 4 and frequency error measuring units 5-1–5-n have been informed of by cell detector 3. Controller 10 also compares the reception power and S/N of received signals from respective base stations which have been informed by cell detector 3 to select the base station which provides the best connecting condition as a connectable destination, and to select a plurality of base stations which are ranked as providing better connecting conditions, as base stations that can be originating stations of signals which should be measured by frequency error measuring units 5-1–5-n.

Controller 10 further preserves in memory 11 scramble codes (or identification IDs) and frequency errors as informed by frequency error measuring units 5-1–5-n together with the TCXO control voltage applied from TCXO control voltage selector 7 as a set. Controller 10 further switches a base station (cell/sector) utilized for frequency control in accordance with the information (scramble code, frame timing, identification ID and the like) of base stations (cells/sectors) informed by cell detector 3, and informs TCXO control voltage selector 7 of the switching when the CDMA mobile station is turned on or returns from an out-of-coverage area, when the reception power fluctuates, or the like.

In addition, for switching a base station (cell/sector) utilized for frequency control (hand-over), caused by power-on, return from an out-of-coverage area, fluctuations in the reception power, or the like, controller 10 reads a frequency error and TCXO control voltage corresponding to a new base station (cell/sector) to be connected from memory 11, if a scramble code (or identification ID) of the new base station is stored in memory 11, and sets the read information in TCXO control voltage calculator (any of 6-1–6-n) corresponding to the base station (cell/sector) utilized for frequency control, which TCXO control voltage selector 7 has been informed of.

Memory 11 preserves the scramble code (or identification ID) of each base station (cell/sector) as well as a frequency error and TCXO control voltage corresponding thereto.

Figure 2:
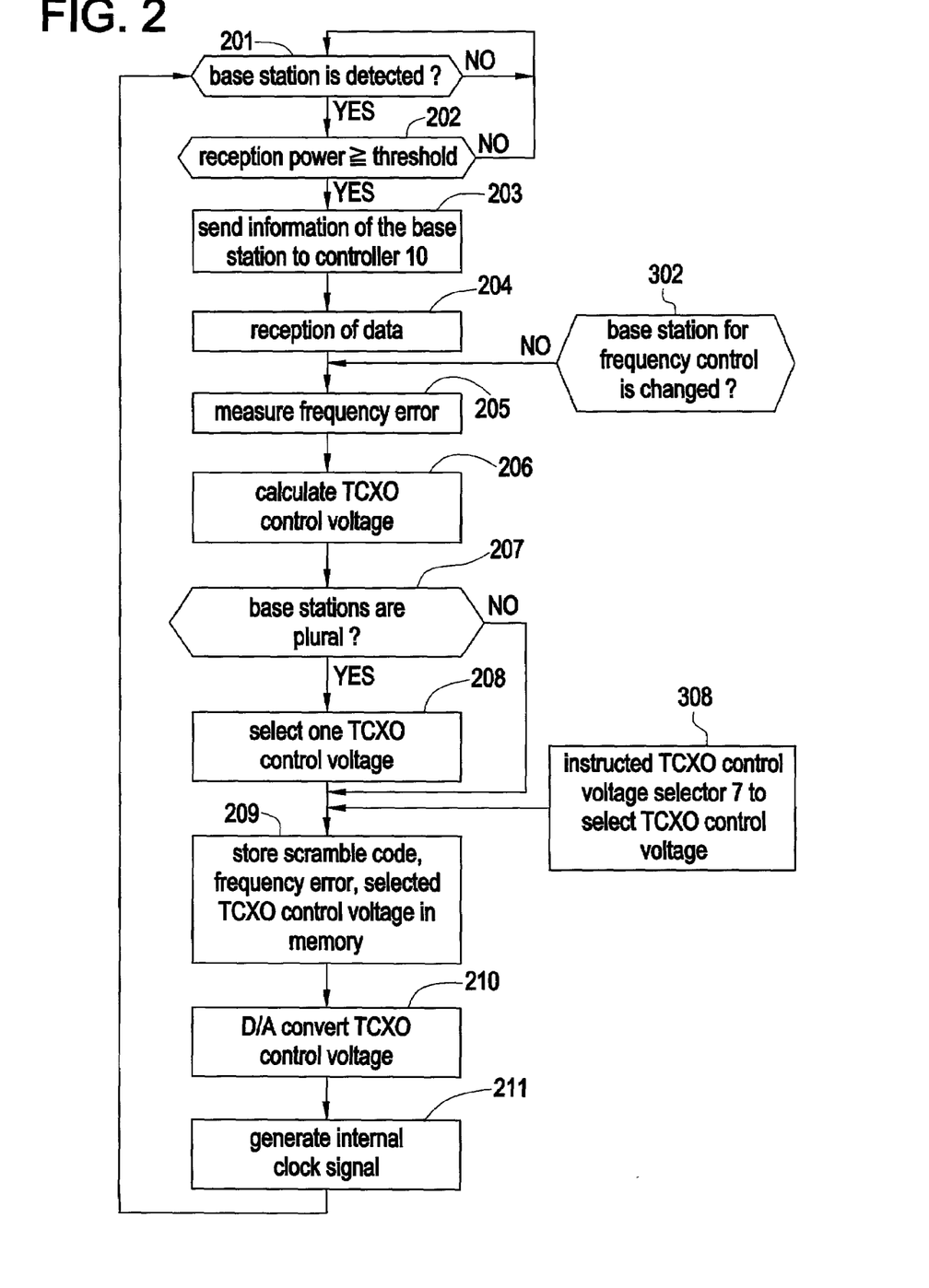
FIG. 2 is a flow chart illustrating the operation for an automatic frequency control performed by the CDMA mobile station according to the first embodiment of the present invention when it is in a normal state.

FIG. 2 is a flow chart illustrating the operation for an automatic frequency control performed by the CDMA mobile station according to the first embodiment of the present invention when it is in a normal state.

Referring to FIG. 2, cell detector 3 first detects a base station (cell/sector) at step 201. Cell detector 3 can detect a plurality of base stations. Next, cell detector 3 determines at step 202 whether or not any of detected base stations (cell/sectors) has reception power, as measured at the CDMA mobile station, which is equal to or higher than a certain threshold.

When determining at step 202 that there is at least one base station having the reception power equal to or higher than the threshold, cell detector 3 sends information (scramble code, frame timing, identification ID and the like) of the base station to controller 10 at step 203. Conversely, when determining at step 202 that there is not any such base station (cell/sector), cell detector 3 returns to step 201.

Next, at step 204, data receiver 4 performs processing involved in reception of data from a plurality of base stations (cells/sectors) specified by controller 10 in accordance with the information (scramble code, frame timing and the like) of the base stations (cells/sectors) specified by controller 10. Since the reception of data by data receiver 4 has been described and may be identical to the known technologies, description thereon is herein omitted.

Next, at step 205, frequency error measuring units 5-1–5-n each receive a pilot signal (signal having a known pattern) from a base station (cell/sector) specified by the information (scramble code, frame timing and the like) of the base stations (cells/sectors) from controller 10. Then, frequency error measuring units 5-1–5-n each measure the rotation of the pilot signal on the phase plane to measure a frequency error of the frequency of the internal clock signal (output frequency of TCXO 9) used in the CDMA mobile station with respect to the frequency of a clock signal used in the specified base station (cell/sector).

Next, at step 206, TCXO control voltage calculators 6-1–6-n each integrate the frequency error from associated frequency error measuring unit 5-i ($1 \leq i \leq n$) to calculate a TCXO control voltage for a specified base station (cell/sector).

Next, at step 207, controller 10 proceeds to step 208 when there are a plurality of base stations (cells/sectors), and otherwise to step 209.

At step 208, controller 10 selects one of the base stations (cells/sectors) to utilize in the frequency control. Specifically, at step 208, controller 10 selects one of the base stations (cells/sectors) which have the reception power equal to or higher than the threshold, to which the CDMA mobile station is currently in connection (for standby, position registration, communication, or the like), as a base station (cell/sector) utilized for the frequency control, and applies a selection signal to TCXO control voltage selector 7. Simultaneously with such processing, controller 10 continuously measures a frequency error as shown in step 205, calculates the TCXO control voltage as shown in step 206, and preserves the resulting data in the memory 11 at all times for the remaining base stations (cells/sectors). When the CDMA mobile station is handing over (in communication with a plurality of base stations (cells/sectors)), controller 10 selects, for example, the base station which presents the highest power or highest S/N as a base station (cell/sector) utilized for the frequency control. At this point, therefore, controller 10 may proceed to step 301 which shows the frequency control as required when the base station is switched.

At step 209, controller 10 preserves in memory 11 the scramble code (or identification ID) and frequency error for each of base stations (cells/sectors) provided by respective frequency error measuring units 5-1–5-n, and the TCXO control voltage of the selected base station (cell/sector) applied from TCXO control voltage selector 7.

Next to step 209, TCXO control D/A converter 8 D/A converts the TCXO digital control voltage from TCXO control voltage selector 7 to produce a TCXO analog control voltage which is applied to TCXO 9 at step 210.

Next, at step 211, TCXO 9 generates an internal clock signal of the CDMA mobile station in accordance with the TCXO control analog voltage from TCXO control D/A converter 8.

Figure 3:
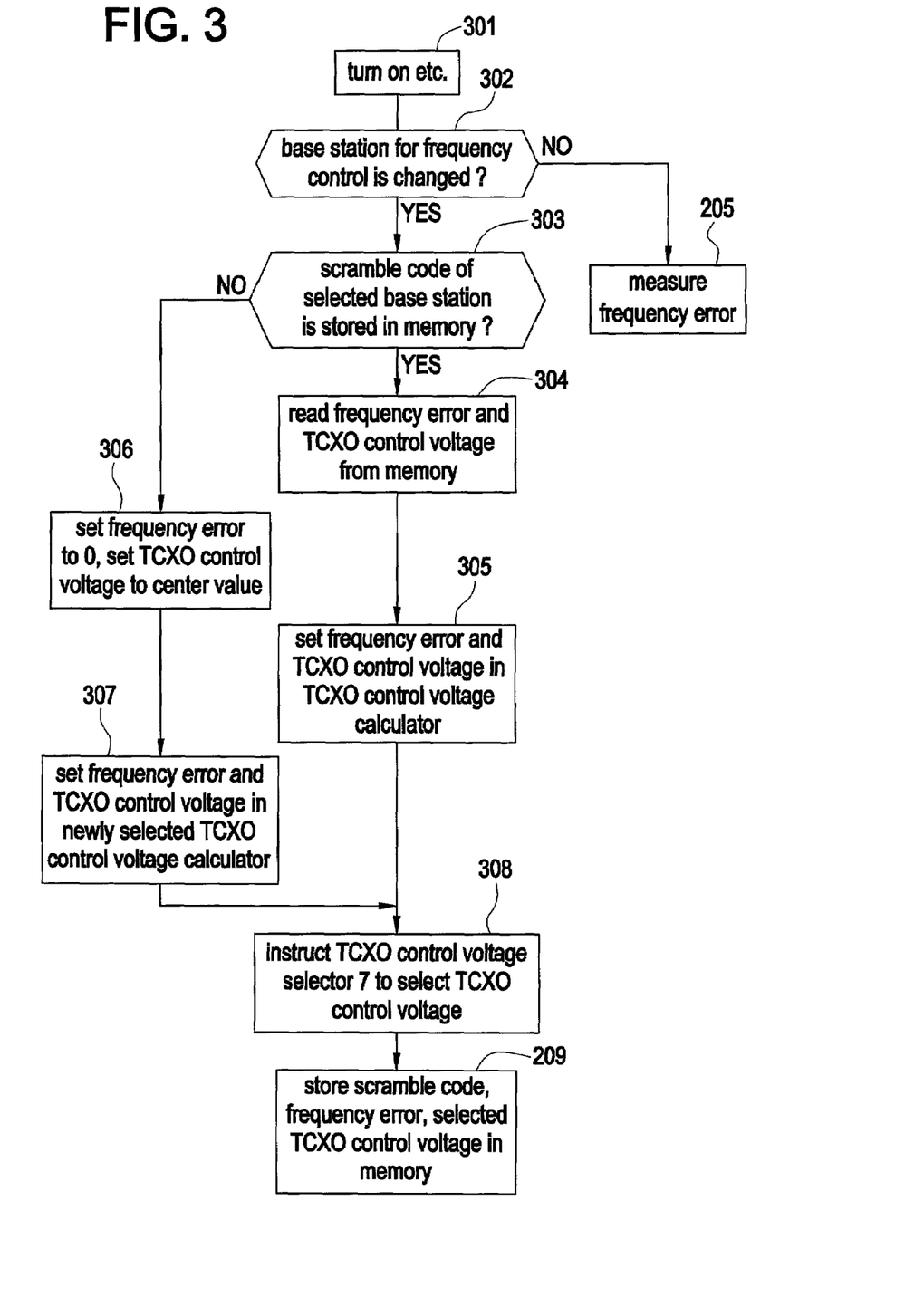
FIG. 3 is a flow chart illustrating the operation for the automatic frequency control performed by the CDMA mobile station according to the first embodiment of the present invention when a base station is switched.

FIG. 3 is a flow chart illustrating the operation for the automatic frequency control performed by the CDMA mobile station according to the first embodiment of the present invention when the base station is switched.

At step 301, the following processing begins when the CDMA mobile station is turned on or returns from an out-of-coverage area, or when fluctuations are detected in the reception power from each base station (cell/sector) by cell detector 3.

At step 302, controller 10 determines whether or not the base station (cell/sector) utilized for the frequency control should be switched, and proceeds to step 303 when it determines that the base station should be switched, and otherwise to step 205. Here, as the base station (cell/sector) utilized for the frequency control, controller 10 selects one of base stations (cells/sectors) having the reception power equal to or higher than the threshold, to which the CDMA mobile station is currently in connection (for standby, position registration, communication, or the like).

Simultaneously with this processing, controller 10 continuously measures frequency errors for the remaining base stations (cells/sectors) as shown in step 205, calculates the TCXO control voltage as shown in step 206, and preserves the information in memory 11 as shown in step 209, and the like.

At step 303, controller 10 checks whether or not a scramble code (or identification ID) of a newly selected base station (cell/sector) has been preserved in memory 11, and proceeds to step 304 when preserved, and otherwise to step 306.

At step 304, controller 10 reads a frequency error and TCXO control voltage of the newly selected base station (cell/sector) from memory 11. It should be noted that the TCXO control voltage herein referred to is the TCXO control voltage selected by TCXO control voltage selector 7. Also, the frequency error of the newly selected base station refers to the frequency error which was delivered last by frequency error measuring unit 5-i ($1 \leq i \leq n$) that is assigned to the processing for the newly selected base station.

Next to step 304, controller 10 sets at step 305 the frequency error and TCXO control voltage of the newly selected base station (cell/sector) in TCXO control voltage calculator 6-i ($0 \leq i \leq n$) which is assigned to the processing for that base station. In this event, this TCXO control voltage calculator 6-i invalidates the TCXO control voltage previously calculated by integrating the frequency error from frequency error measuring unit 5-i before starting the processing using the newly set frequency error and TCXO control voltage.

At step 306, controller 10 sets the frequency error of the newly selected base station (cell/sector) to zero, and sets the TCXO control voltage such that the frequency of the internal clock signal generated by TCXO 9 is positioned as the center frequency.

Next to step 306, controller 10 sets at step 307 the TCXO control voltage and the frequency error of the newly selected base station (cell/sector) in a newly selected TCXO control voltage calculator 6-i ($0 \leq i \leq n$) (for example, TCXO control voltage calculator corresponding to the base station which presents the lowest reception power). In this event, this particular TCXO control voltage calculator 6-i starts processing using the newly set TCXO control voltage and frequency error.

Next to step 305 or 307, controller 10 instructs TCXO control voltage selector 7 at step 308 to select a TCXO control voltage generated by TCXO control voltage calculator 6-i ($0 \leq i \leq n$) in which controller 10 has set the TCXO control voltage and frequency error. From step 308, controller 10 proceeds to step 209.

Figure 4:
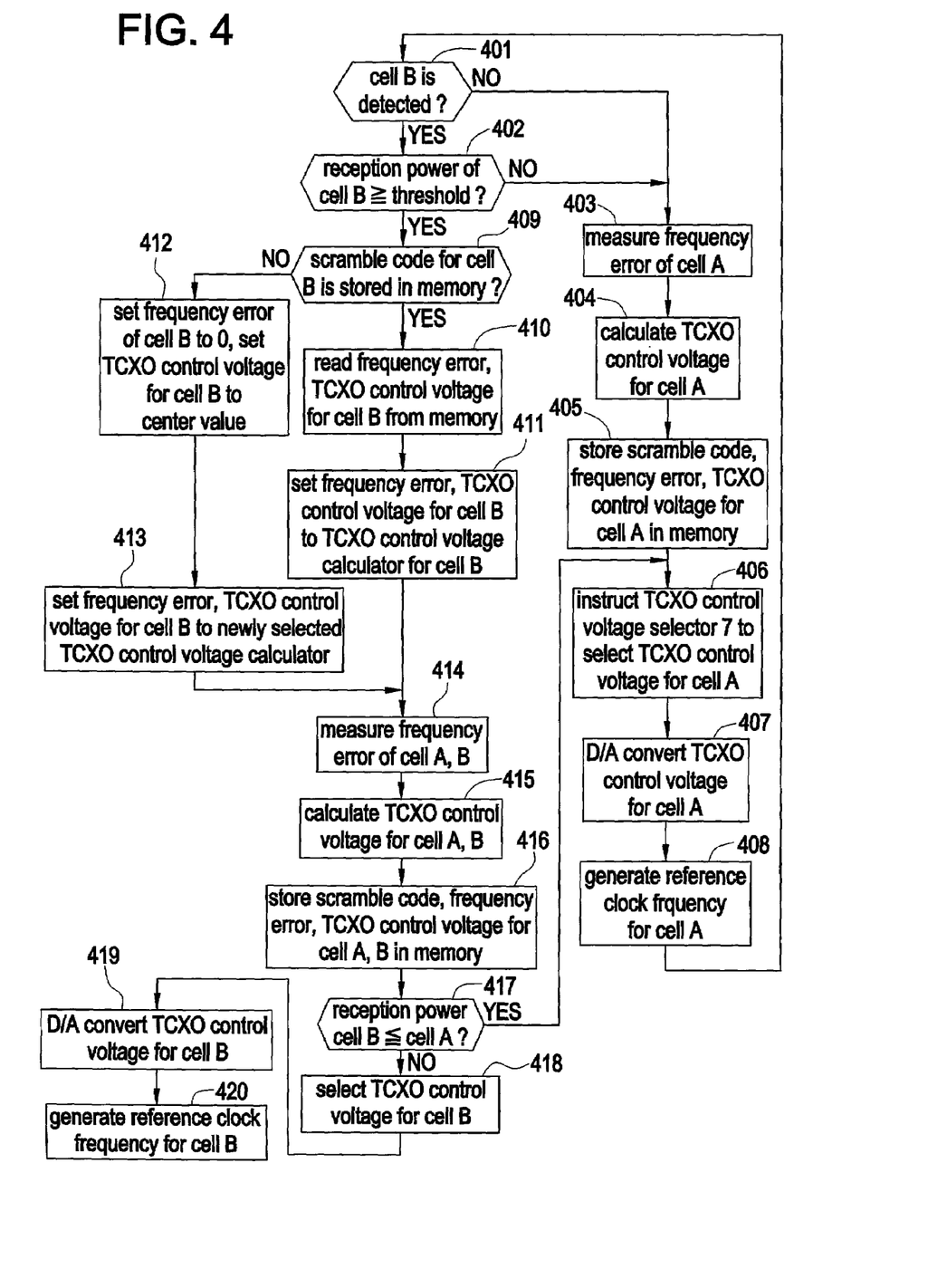
FIG. 4 is a flow chart illustrating the operation for the automatic frequency control performed by the CDMA mobile station according to the first embodiment of the present invention when it hand over from cell A to cell B.

FIG. 4 is a flow chart illustrating the operation for the automatic frequency control performed by the CDMA mobile station according to the first embodiment of the present invention when it hand over from cell A to cell B.

Referring to FIG. 4, in a frequency control loop (steps 401–408) for cell A, controller 10 first determines at step 401 whether or not cell B has been detected, and proceeds to step 402 when determining that cell B has been detected, and to step 403 when determining that cell B has not been detected. It should be noted that cell B does not refer to a particular cell but an arbitrary cell other than cell A.

Controller 10 determines at step 402 whether or not cell B has reception power equal to or higher than a certain threshold, and proceeds to step 409 when determining that the reception power of cell B is equal to or higher than the threshold, and to step 403 when determining that the reception power of cell B is lower than the threshold.

In a loop formed of steps 403–408, controller 10 performs the frequency control for cell A. Specifically, frequency error measuring unit 5-i ($1 \leq i \leq n$) corresponding to cell A measures a frequency error at step 403, and TCXO control voltage calculator 6-i ($1 \leq i \leq n$) corresponding to cell A calculates a TCXO control voltage for cell A at step 404. Then, controller 10 preserves the scramble code, TCXO control voltage and frequency error of cell A in memory 11 at step 405, and instructs TCXO control voltage selector 7 at step 406 to select the TCXO control voltage for cell A which is generated by TCXO control voltage calculator 6-i corresponding to cell A. Then, TCXO control D/A converter 8 D/A converts the TCXO digital control voltage for cell A at step 407, and TCXO 9 supplies at step 408 radio unit 2 and respective components of the CDMA mobile station with the internal clock signal at a frequency determined by a TCXO analog control voltage for cell A.

At step 409, controller 10 determines whether or not a scramble code of cell B is stored in memory 11, and proceeds to step 410 when determining that the scramble code of cell B is stored in memory 11, and to step 412 when determining that the scramble code of cell B is not stored in memory 11.

At step 410, controller 10 reads the TCXO control voltage, and a frequency error of cell B from memory 11. The TCXO control voltage herein referred to is the TCXO control voltage selected by TCXO control voltage selector 7 when the frequency error was measured lastly for cell B.

Next to step 410, controller 10 sets the TCXO control voltage, and the frequency error of cell B read at step 410 in TCXO control voltage calculator 6-j ($1 \leq j \leq n$, $i \neq j$) corresponding to cell B at step 411. In this event, this TCXO control voltage calculator 6-j invalidates the TCXO control voltage previously calculated by integrating the frequency error from frequency error measuring unit 5-j before it starts processing using the newly set TCXO control voltage and frequency error.

At step 412, controller 10 sets the frequency error of cell B to zero, and sets the TCXO control voltage such that the frequency of the internal clock signal generated by TCXO 9 is positioned as the center frequency.

Next to step 412, controller 10 sets the TCXO control voltage (=center value) and the frequency error (=0) of cell B in the newly selected TCXO control voltage calculator 6-j ($0 \leq j \leq n$, $i \neq j$) (for example, TCXO control voltage calculator corresponding to the base station which presents the lowest reception power). In this event, this particular TCXO control voltage calculator 6-j begins processing using the newly set TCXO control voltage and frequency error.

Next to step 411 or 413, at step 414, frequency error measuring unit 5-i corresponding to cell A measures a frequency error of cell A, while frequency error measuring unit 5-j corresponding to cell B measures a frequency error of cell B. Then, at step 415, TCXO control voltage calculator ($1 \leq i \leq n$) corresponding to cell A calculates a TCXO control voltage for cell A, while TCXO control voltage calculator 6-j corresponding to cell B calculates a TCXO control voltage for cell B. Then, at step 416, controller 10 preserves the TCXO control voltages, the scramble code and frequency error of cell A, and the scramble code and frequency error of cell B in memory 11.

Next, controller 10 determines at step 417 whether or not the reception power of cell B is equal to or lower than the reception power of cell A, and proceeds to step 506 when determining that the reception power of cell B is equal to or lower than the receiving power of cell A, and to step 419 when determining that the reception power of cell B is higher than the reception power of cell A.

At step 418, controller 10 instructs TCXO control voltage selector 7 to select the TCXO control voltage for cell B generated by TCXO control voltage calculator 6-j corresponding to cell B.

Next, TCXO control D/A converter 8 D/A converts the TCXO digital control voltage for cell B at step 419. Then, TCXO 9 supplies radio unit 2 and respective components of the CDMA mobile station with the internal clock signal at a frequency determined by a TCXO analog control voltage for cell B at step 420.

The CDMA mobile station in the first embodiment continues to measure a frequency error at all times for a base station (cell/sector) which presents the reception power equal to or higher than a certain threshold irrespective of whether it is in a hand-over condition or not, and stores in the memory the frequency error corresponding to the scramble code (or identification ID) of the base station (cell/sector), and a current TCXO control voltage as a set. Therefore, when the CDMA mobile station switches the base station (cell/sector) utilized for the frequency control (hand over), caused by its powering-on or returning from an out-of-coverage area, fluctuations in reception power, or the like, controller 10 can read a frequency error and TCXO control voltage corresponding to a scramble code of a new base station (cell/sector), to which the CDMA mobile station is to be connected, from the memory, if it has been stored therein, for utilization in the frequency control.

As appreciated from the foregoing, according to the CDMA mobile station of the first embodiment, for switching the base station (cell/sector) utilized for the frequency control (hand-over), caused by its powering-on or returning from an out-of-coverage area, fluctuations in reception power, or the like, the CDMA mobile station can rapidly converge the frequency error for the new base station (cell/sector) to which it is connected. This benefit can be provided even if large frequency errors are found among a plurality of base stations.

Second Embodiment

Next, description will be made of a mobile station according to a second embodiment of the present invention.

In the aforementioned first embodiment, TCXO control voltage selector 7 selects one of TCXO control voltages generated by a plurality of TCXO control voltage calculators 6-1–6-n, whereas in the second embodiment, frequency error selector 12 selects one of frequency errors measured by a plurality of frequency error measuring units 5-1–5-n.

The second embodiment can reduce the circuit scale as compared with the first embodiment because the second embodiment comprises only one TCXO control voltage calculator while the first embodiment comprises a plurality of TCXO control voltage calculators.

Figure 5:
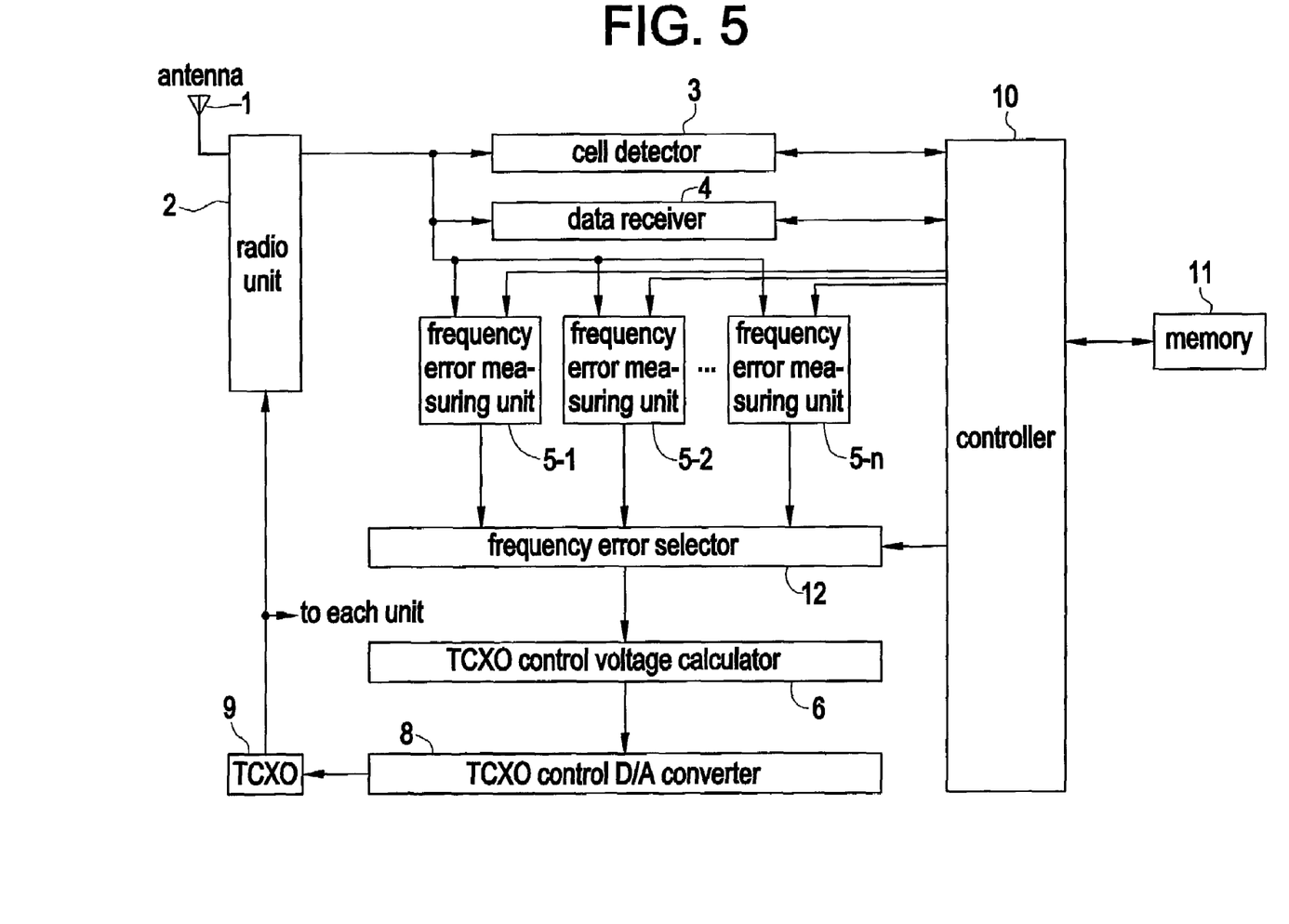
FIG. 5 is a block diagram illustrating the configuration of a CDMA mobile station according to a second embodiment of the present invention.

FIG. 5 is a block diagram illustrating the configuration of the CDMA mobile station according to the second embodiment of the present invention. In FIG. 5, components identical to those in FIG. 1 are designated with the same reference numerals, and description thereon is omitted. Referring to FIG. 5, the CDMA mobile station according to the second embodiment of the present invention comprises antenna 1; radio unit 2; cell detector 3; data receiver 4; a plurality of frequency error measuring units 5-1–5-n; TCXO control voltage calculator 6; TCXO control D/A converter 8; TCXO 9; controller 10, memory 11; and frequency error selector 12.

Frequency error measuring units 5-1–5-n each receive a pilot signal (signal having a known pattern) from a base station (cell/sector) specified by controller 10 through a rake receiver, utilizing information (scrambling code, frame timing and the like) on the specified base station (cell/sector), and measures rotation of the pilot signal on a phase plane to measure a frequency error of the frequency of an internal clock signal (output frequency of TCXO 9) used in the CDMA mobile station with respect to the frequency of a clock signal used in the specified base station (cell/sector). It should be noted that while the rake receiver in data receiver 4 receives signals from a plurality of base stations, the rake receiver in each of frequency error measuring units 5-1–5-n only receives a signal from a single base station. Also, each of frequency error measuring units 5-1–5-n applies the measured frequency error to frequency error selector 12. However, the TCXO control signal is applied to controller 10 from TCXO control voltage calculator 6.

TCXO control voltage calculator 6 integrates a frequency error selected by frequency error selector 12 out of the frequency errors measured by frequency error measuring units 5-1–5-n to calculate the TCXO control voltage.

Alternatively, controller 10 may set a frequency error and TCXO control voltage for TCXO control voltage calculator 6, instead of integrating the frequency error from frequency error selector 12 to calculate the TCXO control voltage in TCXO control voltage calculator 6.

TCXO control voltage calculator 6 informs controller 10 of the calculated TCXO control voltage together with the scramble code (or identification ID) and frequency error of the base station (cell/sector) in frequency error measuring unit 5-1–5-n as a set. However, controller 10 is informed of the frequency error from frequency error measuring unit 5-i ($1 \leq i \leq n$).

TCXO control D/A converter 8 D/A converts the TCXO digital control voltage from TCXO control voltage calculator 6 to produce a TCXO analog control voltage which is supplied to TCXO 9.

TCXO 9 generates an internal clock signal at a frequency in accordance with the TCXO analog control voltage from TCXO control D/A converter 8, and supplies the internal clock signal to radio unit 2 and respective components which use the internal clock signal for processing digital signals.

Controller 10 sends the information (scramble code, frame timing, identification ID, and the like) of the base station (cell/sector) which cell detector 3 has sent to data receiver 4 and frequency error measuring units 5-1–5-n.

Controller 10 also compares reception power and S/N of a received signal from each base station which have been informed by cell detector 3 to select the base station which provides the best connecting condition as a connectable destination, and selects a plurality of base stations which are ranked as providing better connecting conditions, as base stations that can be originating stations of signals which should be measured by frequency error measuring units 5-1–5-n.

Controller 10 further preserves in memory 11 scramble codes (or identification IDs) and frequency errors as informed by frequency error measuring units 5-1–5-n as well as the TCXO control voltage applied from TCXO control voltage calculator 6 as a set.

Controller 10 further switches a base station (cell/sector) utilized for frequency control in accordance with the information (scramble code, frame timing, identification ID and the like) of base stations (cells/sectors) as informed by cell detector 3, and informs frequency error selector 12 of the switching when the CDMA mobile station is turned on or returns from an out-of-coverage area, when the reception power fluctuates, or the like.

In addition, for switching a base station (cell/sector) utilized for frequency control, caused by power-on, return from an out-of-coverage area, fluctuations in the reception power, or the like (hand-over), controller 10 reads from memory 11 a frequency error and TCXO control voltage corresponding to a new base station (cell/sector) to be connected, if a scramble code (or identification ID) of the new base station is stored in memory 11, and sets the read information in TCXO control voltage calculator 6.

Memory 11 preserves the scramble code (or identification ID) of each base station (cell/sector) as well as a frequency error and TCXO control voltage corresponding thereto.

Frequency error selector 12 selects one frequency error specified by controller 10 out of frequency errors measured by frequency error measuring units 5-1–5-n, and supplies the selected frequency error to TCXO control voltage calculator 6.

Figure 6:
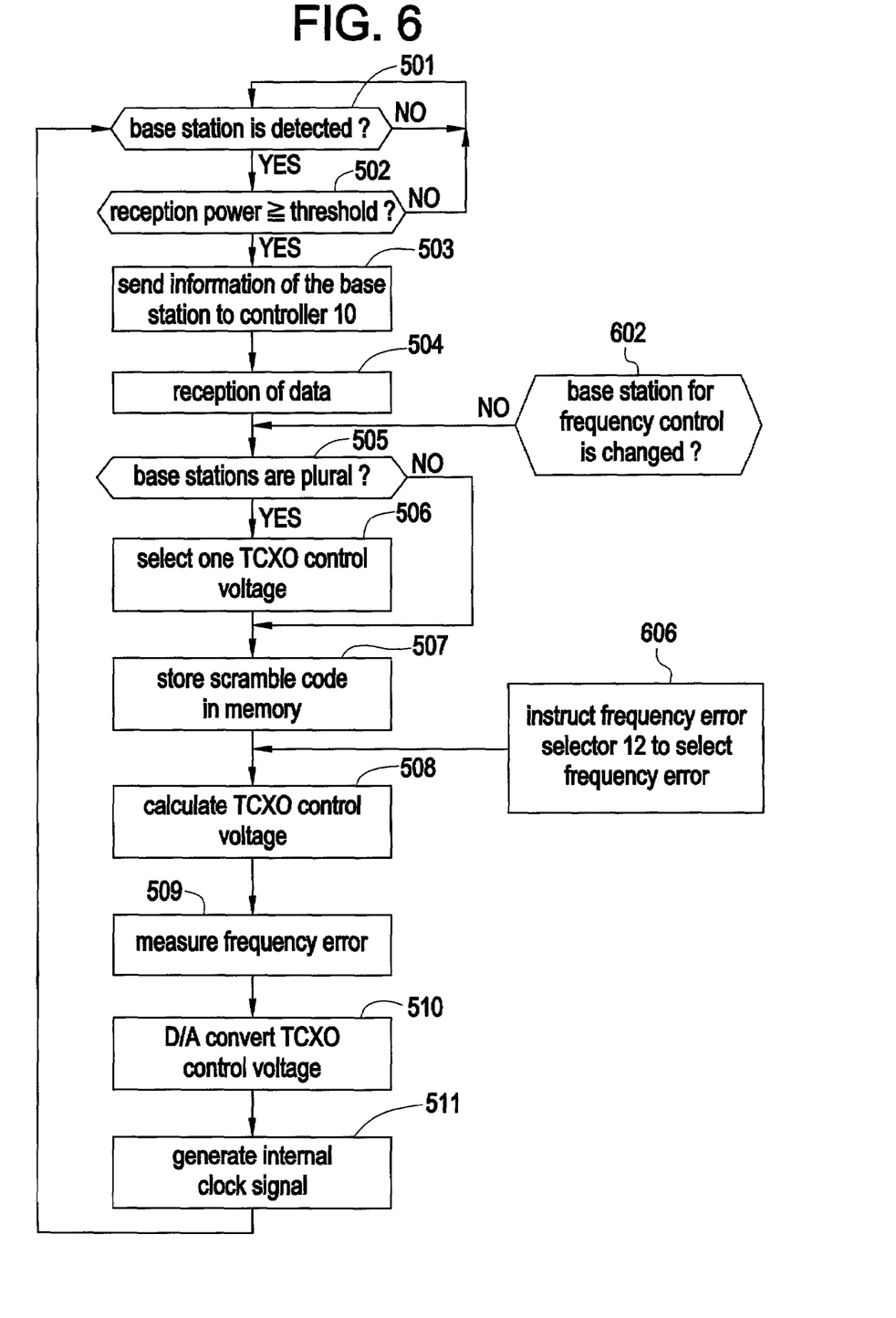
FIG. 6 is a flow chart illustrating the operation for an automatic frequency control performed by the CDMA mobile station according to the second embodiment of the present invention when it is in a normal state.

FIG. 6 is a flow chart illustrating the operation for the automatic frequency control performed by the CDMA mobile station according to the second embodiment of the present invention when it is in a normal state.

Referring to FIG. 6, cell detector 3 first detects a base station (cell/sector) at step 501. Cell detector 3 can detect one or a plurality of base stations.

Next, cell detector 3 determines at step 502 whether or not any of detected base stations (cells/sectors) has the reception power, as measured at the CDMA mobile station, which is equal to or higher than a certain threshold. When determining at step 502 that there is at least one base station having the reception power equal to or higher than the threshold, cell detector 3 sends information (scramble code, frame timing, identification ID and the like) of the base station to controller 10 at step 503. Conversely, when determining at step 502 that there is not any base station (cell/sector) having the reception power equal to or higher than the threshold, cell detector 3 returns to step 501.

Next, at step 504, data receiver 4 performs processing involved in reception of data from a plurality of base stations (cells/sectors) specified by controller 10 in accordance with the information (scramble code, frame timing and the like) of the base stations (cells/sectors) specified by controller 10. Since the reception of data by data receiver 4 has been described and may be identical to the known technologies, description thereon is herein omitted.

Next, at step 505, controller 10 proceeds to step 506 when there are a plurality of base stations (cells/sectors) and otherwise to step 507.

At step 506, controller 10 selects one of the base stations (cells/sectors) to utilize in the frequency control. Specifically, at step 506, controller 10 selects one of the base stations (cells/sectors) which have the reception power equal to or higher than the threshold, to which the CDMA mobile station is currently in connection (for standby, position registration, communication, or the like), as a base station (cell/sector) utilized for the frequency control, and applies a selection signal to frequency error selector 12. When the CDMA mobile station is handing over (in communication with a plurality of base stations (cells/sectors), controller 10 selects, for example, the base station which presents the highest power or the highest S/N as a base station utilized for the frequency control. Therefore, controller 10 may proceed from this processing to step 601 which shows the frequency control as required when the base station is switched.

At step 507, controller 10 preserves in memory 11 the scramble codes (or identification IDs) of base stations (cells/sectors) assigned to respective frequency error measuring units 5-1–5-n.

Next, at step 508, TCXO control voltage calculator 6 integrates one of frequency errors measured by frequency error measuring units 5-1–5-n selected by frequency error selector 12 to calculate a TXCO control voltage.

Next, at step 509, each of frequency error measuring units 5-1–5-n receives a pilot signal (signal having a known pattern) from a base station (cell/sector) specified by the information (scramble codes, frame timings and the like) of the base stations supplied from controller 10, and measures rotation of the pilot signal on a phase plane to measure a frequency error of the frequency of the internal clock signal (output frequency of TCXO 9) used in the CDMA mobile station with respect to the frequency of a clock signal used in the specified base station (cell/sector).

Next to step 509, TCXO control D/A converter 8 D/A converts the TCXO digital control voltage from TCXO control voltage calculator 6 to produce a TCXO analog control voltage which is applied to TCXO 9 at step 510.

Next, at step 511, TCXO 9 generates an internal clock signal of the CDMA mobile station in accordance with the TCXO control analog voltage from TCXO control D/A converter 8.

Figure 7:
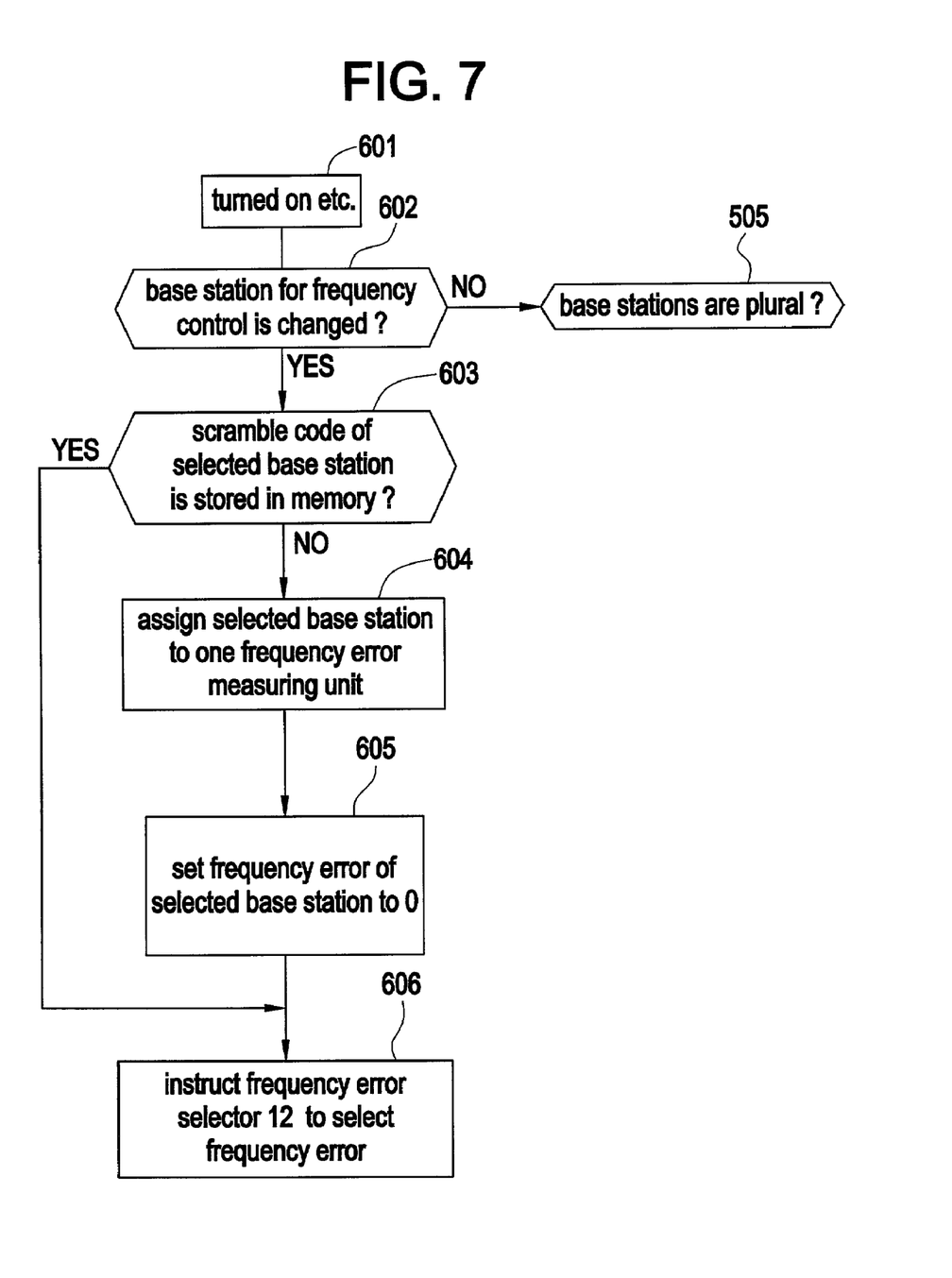
FIG. 7 is a flow chart illustrating the operation for the automatic frequency control performed by the CDMA mobile station according to the second embodiment of the present invention when a base station is switched.

FIG. 7 is a flow chart illustrating the operation for the automatic frequency control performed by the CDMA mobile station according to the second embodiment of the present invention when the base station is switched.

Referring to FIG. 7, the illustrated operation starts, as shown in step 601, when the CDMA mobile station is turned on or returns from an out-of-coverage area, or when cell detector 3 detects fluctuations in the reception power from each base station (cell/sector), or the like.

Next, at step 602, controller 10 determines whether or not the base station (cell/sector) utilized for the frequency control should be switched, and proceeds to step 603 when it determines that the base station utilized for the frequency control should be switched, and otherwise to step 505.

Here, as the base station (cell/sector) utilized for the frequency control, controller 10 selects one of base stations (cells/sectors) having the reception power equal to or higher than the threshold, to which the CDMA mobile station is currently in connection (for standby, position registration, communication, or the like). Simultaneously with this processing, controller 10 continuously measures frequency errors for the remaining base stations (cells/sectors) as shown in step 509, calculates the TCXO control voltage as shown in step 508, and the like.

At step 604, controller 10 assigns the selected base station to one of frequency error measuring units 5-1–5-n. The frequency error measuring unit to which the selected base station is assigned may be a frequency error measuring unit which has been so far assigned to a base station that presents the signal having the lowest reception power.

At step 605, controller 10 sets zero to a frequency error measured by the frequency error measuring unit to which the selected base station has been newly assigned.

Next to step 603 or 605, controller 10 instructs frequency error selector 12 at step 606 to select the frequency error measured by frequency error measuring unit 5-i ($0 \leq i \leq n$) to which the selected base station has been newly assigned.

Controller 10 proceeds from step 606 to step 508.

Figure 8:
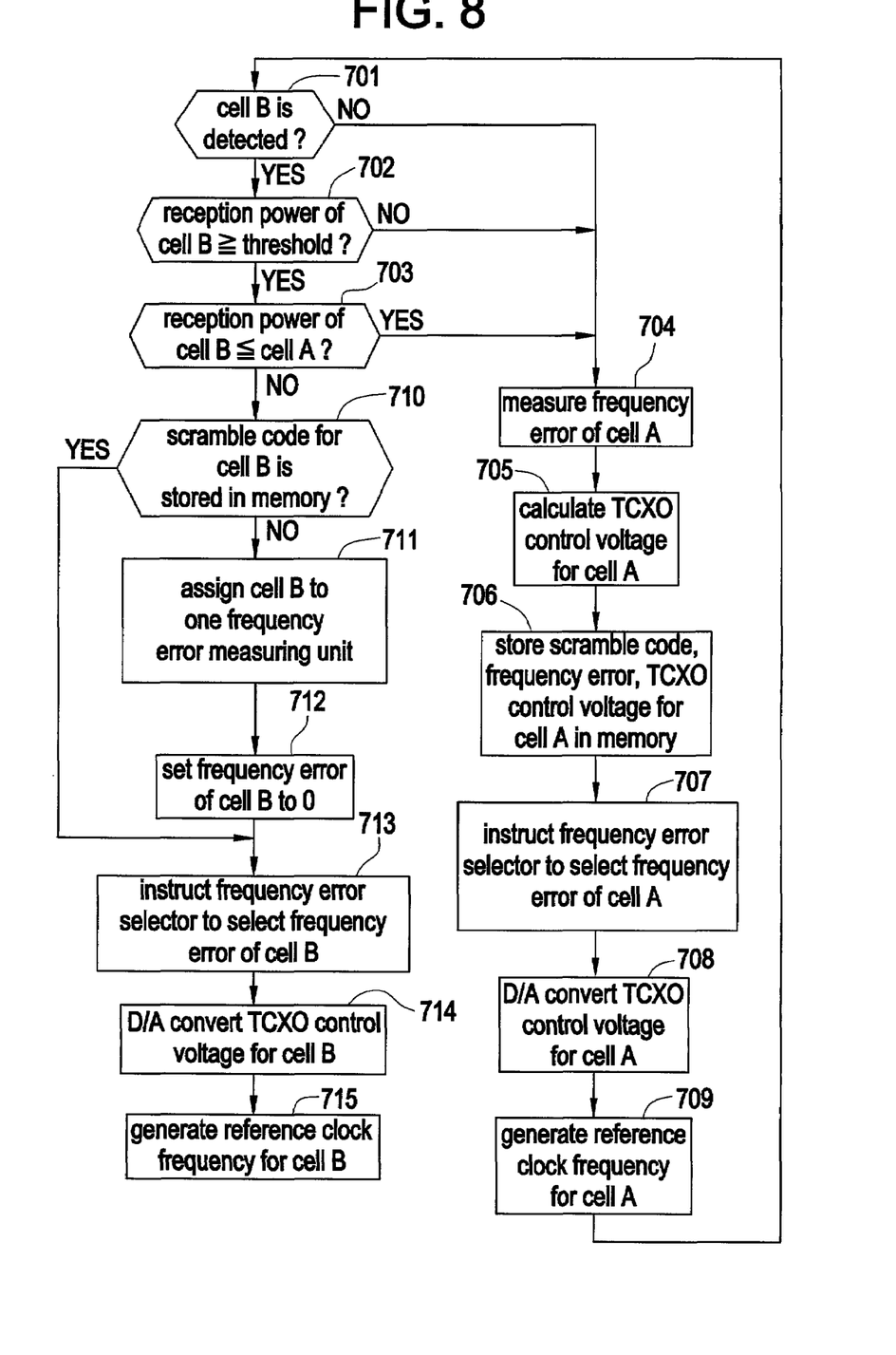
FIG. 8 is a flow chart illustrating the operation for the automatic frequency control performed by the CDMA mobile station according to the second embodiment of the present invention when it hand over from cell A to cell B.

FIG. 8 is a flow chart illustrating the operation for the automatic frequency control performed by the CDMA mobile station according to the second embodiment of the present invention when it hand over from cell A to cell B.

Referring to FIG. 8, in a frequency control loop (steps 701–709) for cell A, controller 10 first determines at step 701 whether or not cell B has been detected, and proceeds to step 702 when determining that cell B has been detected, and to step 704 when determining that cell B has not been detected. It should be noted that cell B does not refer to a particular cell but an arbitrary cell other than cell A.

Controller 10 determines at step 702 whether or not cell B has reception power equal to or higher than a certain threshold, and proceeds to step 703 if so, and otherwise to step 704.

Controller determines at step 703 whether or not the reception power of cell B is equal to or lower than reception power of cell A, and proceeds to step 704 when determining that the reception power of cell B is equal to or lower than the reception power of cell A, and to step 710 when determining that the reception power of cell B is higher than the reception power of cell A.

In a loop formed of steps 704–709, controller 10 performs the frequency control for cell A. Specifically, frequency error measuring unit 5-i ($1 \leq i \leq N$) corresponding to cell A measures a frequency error at step 704, and TCXO control voltage calculator 6 calculates a TCXO control voltage for cell A at step 705. Then, controller 10 preserves a scramble code of cell A in memory 11 at step 706, and instructs frequency error selector 12 at step 707 to select a frequency error of cell A measured by frequency error measuring unit 5-i corresponding to cell A. Then, TCXO control D/A converter 8 D/A converts a TCXO digital control voltage for cell A at step 708, and TCXO 9 supplies at step 709 radio unit 2 and respective components of the CDMA mobile unit with the internal clock signal at a frequency determined by the TCXO analog control voltage for cell A.

Control unit 10 determines at step 710 whether or not a scramble code of cell B has been stored in memory 11, and proceeds to step 713 if so, and otherwise to step 711.

At step 711, controller 10 assigns cell B to one frequency error measuring unit 5-j ($1 \leq j \leq n$) out of frequency error measuring units 5-1–5-n. The frequency error measuring unit to which cell B is assigned may be a frequency error measuring unit which has been so far assigned to a base station that presents the signal having the lowest reception power.

At step 712, controller 10 sets zero to a frequency error measured by frequency error measuring unit 5-j to which cell B has been newly assigned.

Next to step 710 or 712, controller 10 instructs frequency error selector 12 at step 713 to select the frequency error measured by frequency error measuring unit 5-j (0≦j≦n) to which cell B has been assigned.

Next, at step 714, TCXO control D/A converter 8 D/A converts a TCXO digital control voltage for cell B. Then, at step 715, TCXO 9 supplies radio unit 2 and respective components of the CDMA mobile station with the internal clock signal at a frequency determined by the TCXO analog control voltage for cell B.

While preferred embodiments of the present invention have been described using specific terms, such description is for illustrative purpose only, and it is to be understood that changes and variations may be made without departing from the spirit or scope of the following claims.

What is claimed is:

1. A mobile station for performing a frequency control for synchronizing the frequency of an internal clock signal in said mobile station to the frequency of a clock signal in a base station, said mobile station comprising:
    a plurality of frequency error measuring means each for measuring a frequency error between an internal clock signal and a clock signal of a specified base station;
    a plurality of control voltage calculating means each associated with corresponding one of said plurality of frequency error measuring means for integrating a frequency error measured by the corresponding frequency error measuring means to produce a control voltage;
    control voltage selecting means for selecting a single control voltage corresponding to a base station currently in communication with said mobile station from among control voltages calculated by said plurality of control voltage calculating means; and
    clock signal generating means for generating said internal clock signal at a frequency in accordance with the control voltage selected by said control voltage selecting means.

2. The mobile station according to claim 1, further comprising:
    means for storing in a memory a set of a scramble code of each base station corresponding to a frequency error measured by each of said frequency error measuring means corresponding to said base station, and the single control voltage selected by said control voltage selecting means.

3. The mobile station according to claim 2, further comprising:
    means operative when said mobile station is turned on, returns from an out-of-coverage area, or hand over, for reading from said memory a frequency error and a control voltage corresponding to a scramble code of a base station to which said mobile station is newly connected for communication, when the scramble code is stored in said memory, to set the frequency error and the control voltage in a single control voltage calculating means, and for selecting said control voltage calculating means by said control voltage selecting means.

4. The mobile station according to claim 2, further comprising:
    means operative when said mobile station is turned on, returns from an out-of-coverage area, or hand over, for setting a frequency error equal to zero and a control voltage set at a center value in a single control voltage calculating means, when said memory does not store a scramble code of a base station to which said mobile station is newly connected for communication, and for selecting said control voltage calculating means by said control voltage selecting means.

5. The mobile station according to claim 1, further comprising:
    means for switching a control voltage selected by said control voltage selecting means when said mobile station hand over.

6. The mobile station according to claim 5, further comprising:
    means for setting a control voltage calculated by control voltage calculating means which had supplied a control voltage selected before a hand-over, in control voltage calculating means which supplies a control voltage selected after the hand-over.

7. The mobile station according to claim 5, further comprising:
    means for setting a central control voltage and a frequency error equal to zero in control voltage calculating means which supplies a control voltage selected after the hand-over when a base station after the hand-over has not been assigned to any frequency error control means or voltage control means before the hand-over.

8. A mobile station for performing a frequency control for synchronizing the frequency of an internal clock signal in said mobile station to the frequency of a clock signal in a base station, said mobile station comprising:
    a plurality of frequency error measuring means each for measuring a frequency error between an internal clock signal and a clock signal of a specified base station;
    frequency error selecting means for selecting a single frequency error corresponding to a base station currently in communication with said mobile station from among frequency errors measured by said plurality of frequency error measuring means;
    a plurality of control voltage calculating means for integrating a frequency error selected by said frequency error selecting means to produce a control voltage; and
    clock signal generating means for generating said internal clock signal at a frequency in accordance with said control voltage.

9. The mobile station according to claim 8, further comprising:
    means for switching a frequency error selected by said frequency error selecting means when said mobile station hand over.

10. The mobile station according to claim 9, further comprising:
    means for setting a frequency error equal to zero in control voltage calculating means which supplies a control voltage selected after the hand-over, when a base station after the hand over has not been assigned to any frequency error control means before the hand-over.

* * * * *